(12) United States Patent
Mishima

(10) Patent No.: US 8,760,941 B2
(45) Date of Patent: Jun. 24, 2014

(54) DATA TRANSFER CIRCUIT AND DATA TRANSFER METHOD

(71) Applicant: Fujitsu Limited, Kawasaki (JP)

(72) Inventor: Masahiro Mishima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 16 days.

(21) Appl. No.: 13/737,644

(22) Filed: Jan. 9, 2013

(65) Prior Publication Data
US 2013/0258791 A1 Oct. 3, 2013

(30) Foreign Application Priority Data
Mar. 30, 2012 (JP) ................................ 2012-080527

(51) Int. Cl.
*G11C 7/00* (2006.01)

(52) U.S. Cl.
USPC .................................................... 365/189.15

(58) Field of Classification Search
CPC ........................................................ G11C 7/00
USPC .................................................... 365/189.15
See application file for complete search history.

(56) References Cited

U.S. PATENT DOCUMENTS

2002/0118882 A1* 8/2002 Tezuka .......................... 382/218
2007/0230015 A1* 10/2007 Yamashita et al. .............. 360/75
2011/0179337 A1* 7/2011 Chen et al. ..................... 714/763

FOREIGN PATENT DOCUMENTS

JP 2000-124953 A 4/2000

* cited by examiner

*Primary Examiner* — Anthan Tran
(74) *Attorney, Agent, or Firm* — Fujitsu Patent Center

(57) ABSTRACT

A data transfer circuit includes a write circuit to control writing of write data to a memory, a read circuit to control reading of data from the memory, a first circuit to register a store position in the memory at which data written to the memory is stored, and a second circuit to store a data pattern when the write data is comprised of repeated patterns each identical to the data pattern, wherein the write circuit does not register the store position in the first circuit with respect to the written data that is comprised of the repeated patterns each identical to the data pattern stored in the second circuit, and the read circuit reads the data pattern from the second circuit for provision to a source issuing a read request when data requested by the read request corresponds to the data pattern stored in the second circuit.

5 Claims, 23 Drawing Sheets

FIG.2 bit
31                                                                0

| | | | |
|---|---|---|---|
| 0 | Opecode | RQID | Address |
| 1 | byte0 | byte1 | byte2 | byte3 |
| 2 | byte4 | byte5 | byte6 | byte7 |
| 3 | byte8 | byte9 | byte10 | byte11 |
| 4 | byte12 | byte13 | byte14 | byte15 |
| 5 | byte16 | byte17 | byte18 | byte19 |
| 6 | byte20 | byte21 | byte22 | byte23 |
| 7 | byte24 | byte25 | byte26 | byte27 |
| 8 | byte28 | byte29 | byte30 | byte31 |
| 9 | byte32 | byte33 | byte34 | byte35 |
| 10 | byte36 | byte37 | byte38 | byte39 |
| 11 | byte40 | byte41 | byte42 | byte43 |
| 12 | byte44 | byte45 | byte46 | byte47 |
| 13 | byte48 | byte49 | byte50 | byte51 |
| 14 | byte52 | byte53 | byte54 | byte55 |
| 15 | byte56 | byte57 | byte58 | byte59 |
| 16 | byte60 | byte61 | byte62 | byte63 |

FIG.3 bit
31                                                                0

| | | | |
|---|---|---|---|
| 0 | Opecode | RQID | Address |

FIG.5

| TAG[1:0] | MEANING |
|---|---|
| 00 | IDLE (DATA INVALID) |
| 01 | FIRST DATA |
| 10 | DATA |
| 11 | LAST DATA |

FIG.6

DATA PORT (RAM)

| ADDRESS | |
|---|---|
| 8'h00 | entry0 |
| 8'h0F | |
| 8'h10 | entry1 |
| 8'h1F | |
| 8'h20 | entry2 |
| 8'H2F | |
| 8'h30 | entry3 |
| 8'h3F | |
| 8'h40 | entry4 |
| 8'h4F | |
| 8'h50 | entry5 |
| 8'h5F | |
| 8'h60 | entry6 |
| 8'h6F | |
| 8'h70 | entry7 |
| 8'h7F | |

| v | RQID | TABLE ENTRY FOR ENTRY0 |
|---|------|------------------------|
| v | RQID | TABLE ENTRY FOR ENTRY1 |
| v | RQID | TABLE ENTRY FOR ENTRY2 |
| v | RQID | TABLE ENTRY FOR ENTRY3 |
| v | RQID | TABLE ENTRY FOR ENTRY4 |
| v | RQID | TABLE ENTRY FOR ENTRY5 |
| v | RQID | TABLE ENTRY FOR ENTRY6 |
| v | RQID | TABLE ENTRY FOR ENTRY7 |

FIG.9

| v | ADDRESS | CNT |
|---|---------|-----|
| v | ADDRESS | CNT |
| v | ADDRESS | CNT |
| v | ADDRESS | CNT |

} HOLD M SET

F=0: DATA PATTERN IN WHICH byte0=byte1=byte2=byte3=DT
F=1: DATA PATTERN USING DT AS INITIAL VALUE

FIG.26

| next_PTN[n] | LOGIC |
|---|---|
| [07] | r-DTPTN[6] |
| [06] | r-DTPTN[5] |
| [05] | r-DTPTN[4] |
| [04] | r-DTPTN[3] |
| [03] | r-DTPTN[2] |
| [02] | r-DTPTN[1] |
| [01] | r-DTPTN[0] |
| [00] | r-DTPTN[7] ^ r-DTPTN0[5] |

FIG.27

| | VALUE[7:0] |
|---|---|
| INITIAL VALUE | "00100100" |
| ONE CYCLE LATER | "01001001" |
| TWO CYCLES LATER | "10010010" |
| THREE CYCLES LATER | "00100101" |
| FOUR CYCLES LATER | "01001011" |
| ... | |

US 8,760,941 B2

DATA TRANSFER CIRCUIT AND DATA TRANSFER METHOD

CROSS-REFERENCE TO RELATED APPLICATIONS

The present application is based upon and claims the benefit of priority from the prior Japanese Patent Application No. 2012-080527 filed on Mar. 30, 2012, with the Japanese Patent Office, the entire contents of which are incorporated herein by reference.

FIELD

The disclosures herein relate to a data transfer circuit and a data transfer method.

BACKGROUND

An I/O (input and output) port of a CPU (central processing unit) holds a fetch request or a store request supplied from an external I/O device, and supplies such a request to a memory controller. The I/O port further transmits store data to the memory controller in response to a data read request from the memory controller in the case of a store request.

The I/O port includes a request port and a data port. The request port holds the header of each request. The request port may transmit a request to the memory controller, may monitor a time-out period, and may guarantee the order of requests. The data port holds data of each request. Upon receiving a data read request from the memory controller, the data port transmits data corresponding to the read request to the memory controller.

In order to prevent the overflow of requests upon arrival of a larger number of requests than the resources of the I/O port, the number of requests transmitted to the I/O port may be controlled. Methods of controlling the number of requests transmitted to an I/O port include a credit-based control method. In the credit-based control method, an I/O device of a buffer in an I/O interface has a credit value assigned thereto. The credit value increases each time a request is transmitted to the I/O port, and decreases each time one of the resources of the I/O port is released. With this arrangement, the number of resources available at the I/O port, i.e., the number of requests that can be received by the I/O port, is monitored to control the number of transmitted requests, thereby avoiding the overflow of the I/O port.

When the number of requests is to be controlled, the number of requests receivable may be controlled based on the volume of a data port, or the number of requests may be controlled based on the volume of a request port. In the case of control based on the volume of a data port, a request port may need to have a large volume in order to cope with a case in which a large number of fetch requests relating to small packet size occur. In the case of control based on the volume of a request port, a data port may need to have a large volume sufficient to store data for all the received requests in order to cope with a case in which a large number of store requests relating to large packet size occur.

In consideration of this, the number of requests may be controlled based on the buffer data size of the data port and the number of requests of the request port by taking into account performance and a balance of the physical amounts of hardware units. In such a method, however, when requests of one type, i.e., either a fetch request or a store request, is temporarily issued in a far larger number than the other type of request, resources may not be fully utilized, or a sufficient amount of resources for achieving desired performance may not be present, which may be problematic.

[Patent Document 1] Japanese Patent Application Publication No. 2000-124953

SUMMARY

According to an aspect of the embodiment, a data transfer circuit includes a memory, a write control circuit configured to control writing of write data to the memory, a read control circuit configured to control reading of data from the memory, a first memory circuit configured to register a store position in the memory at which data written to the memory is stored, and a second memory circuit configured to store a data pattern when the write data is comprised of repeated patterns each identical to the data pattern, wherein the write control circuit does not register the store position in the first memory circuit with respect to the written data that is comprised of the repeated patterns each identical to the data pattern stored in the second memory circuit, and the read control circuit reads the data pattern from the second memory circuit rather than from the memory to supply the read data pattern to a source issuing a first read request when data requested by the first read request corresponds to the data pattern stored in the second memory circuit.

A data transfer method includes writing first write data and second write data to a memory, registering in a first memory circuit a first store position in the memory at which the first write data is stored when the first write data is not comprised of repeated patterns, registering a data pattern in a second memory circuit without registering in the first memory circuit a second store position in the memory at which the second write data is stored when the second write data is comprised of repeated patterns each identical to the data pattern, reading the first write data from the first store position in the memory to supply the read first write data to a source issuing a first read request when data requested by the first read request is the data stored in the first store position stored in the first memory circuit, and reading the data pattern from the second memory circuit rather than from the memory to supply the read data pattern to a source issuing a second read request when data requested by the second read request corresponds to the data pattern stored in the second memory circuit.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 2 is a drawing illustrating an example of the format of a store request;

FIG. 3 is a drawing illustrating an example of the format of a fetch request;

FIG. 5 is a drawing for explaining a tag;

FIG. 6 is a drawing for explaining the division of a RAM that constitutes a data port;

FIG. 9 is a drawing illustrating an example of the configuration of a zero-data table;

FIG. 26 is a table illustrating the logic of pattern generation performed by the pattern generation circuit illustrated in FIG. 25;

FIG. 27 is a drawing illustrating an example of pattern generation performed by the pattern generation circuit illustrated in FIG. 25.

DESCRIPTION OF EMBODIMENTS

In the following, embodiments of the invention will be described with reference to the accompanying drawings.

Figure 1:
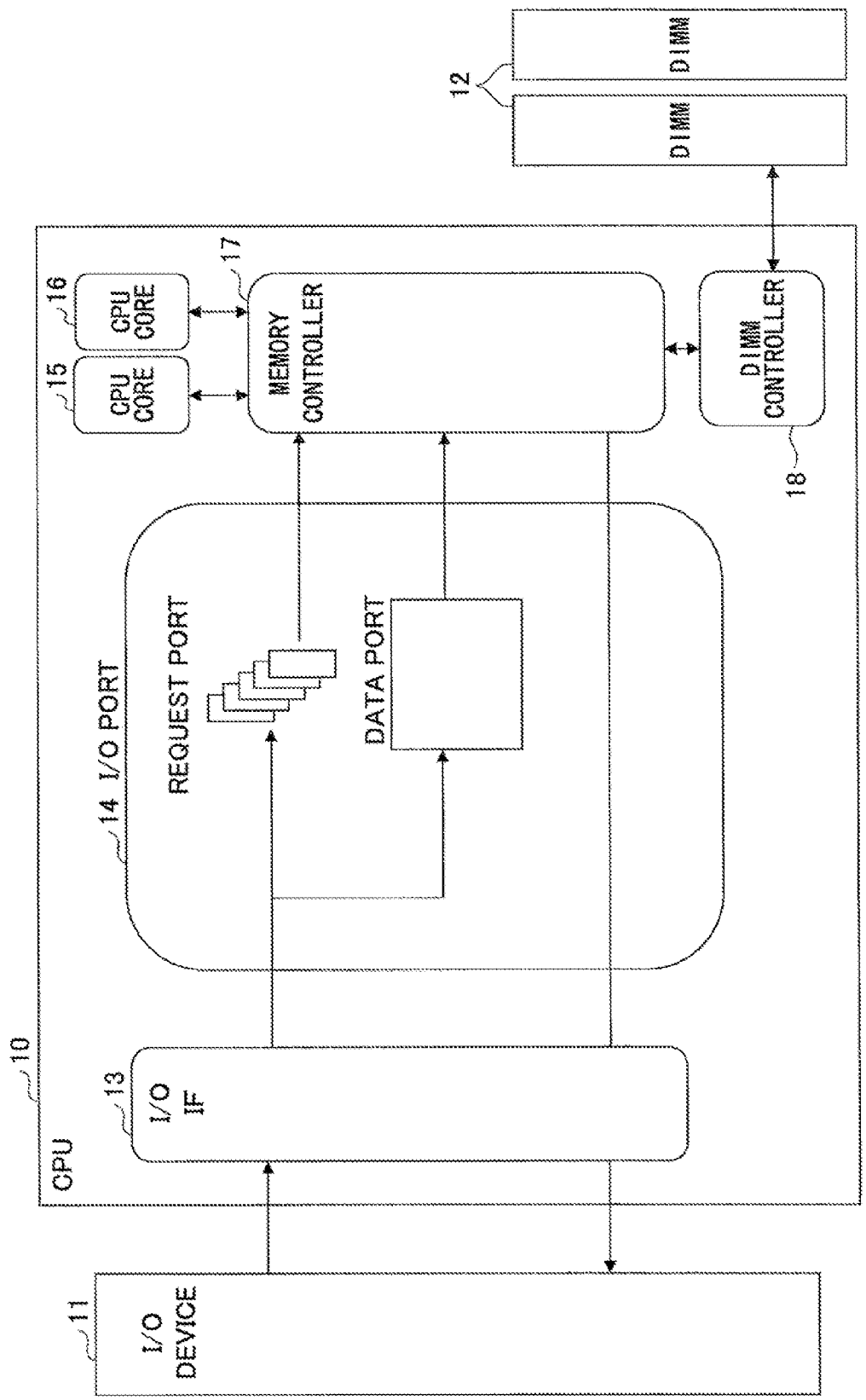
FIG. 1 is a drawing illustrating an example of the configuration of an information processing system.

FIG. 1 is a drawing illustrating an example of the configuration of an information processing system. The information processing system illustrated in FIG. 1 includes a CPU (central processing system) 10, an I/O (input output) device 11, and a DIMM (dual inline memory module) 12. The CPU 10 includes an I/O interface 13, an I/O port 14, a CPU core 15, a CPU core 16, a memory controller 17, and a DIMM controller 18.

The I/O device 11 transmits to the CPU 10 a fetch request for acquiring data from memory or a store request for storing data in memory. The I/O interface 13 of the CPU 10 receives a request from the I/O device 11, and sends the received request to the I/O port 14. The I/O port 14 is a data transfer circuit. The I/O port 14 holds received fetch requests or store requests, and send them to the memory controller 17. The I/O port 14 includes a request port and a data port. The request port holds the header of each request. The request port may transmit a request to the memory controller, may monitor a time-out period following the transmission of a request to the memory controller, and may guarantee the order of requests. The data port holds data of each request in the case of processing store requests. Upon receiving a data read request from the memory controller 17, the data port transmits data corresponding to the read request to the memory controller 17. The CPU 10 has a multi-core structure including the CPU cores 15 and 16. The CPU cores 15 and 16 operate in parallel to perform arithmetic processing and control processing. The memory controller 17 performs a data read operation and a data write operation with respect to the DIMM 12 via the DIMM controller 18.

FIG. 2 is a drawing illustrating an example of the format of a store request. As illustrated in FIG. 2, a store request packet includes an opecode Opecode, a request identifier RQID, a write address Address, and write data byte0 through byte63. Each of the opecode Opecode and the request identifier RQID has a width of one byte. The write address Address has a width of two bytes. The write data byte0 through byte63 are 64 bytes in total. The opecode Opecode, the request identifier RQID, and the write address Address constitute a request header, and the write data byte0 through byte63 constitute the data portion of the request When the store request is transferred through a 32-bit bus, for example, the $0^{th}$ transfer data is the request header, and the $1^{st}$ through $16^{th}$ transfer data are the data portion of the request.

FIG. 3 is a drawing illustrating an example of the format of a fetch request. As illustrated in FIG. 3, a fetch request packet includes an opecode Opecode, a request identifier RQID, and a read address Address. Each of the opecode Opecode and the request identifier RQID has a width of one byte. The read address Address has a width of two bytes. The fetch request packet is 4 bytes in total. The opecode Opecode, the request identifier RQID, and the read address Address constitute a request header, and there is no the data portion in the request. When the fetch request is transferred through a 32-bit bus, the entirety of the request is transferred at once as one transfer data item having a width of 32 bits (i.e., a width of 4 bytes).

Figure 4:
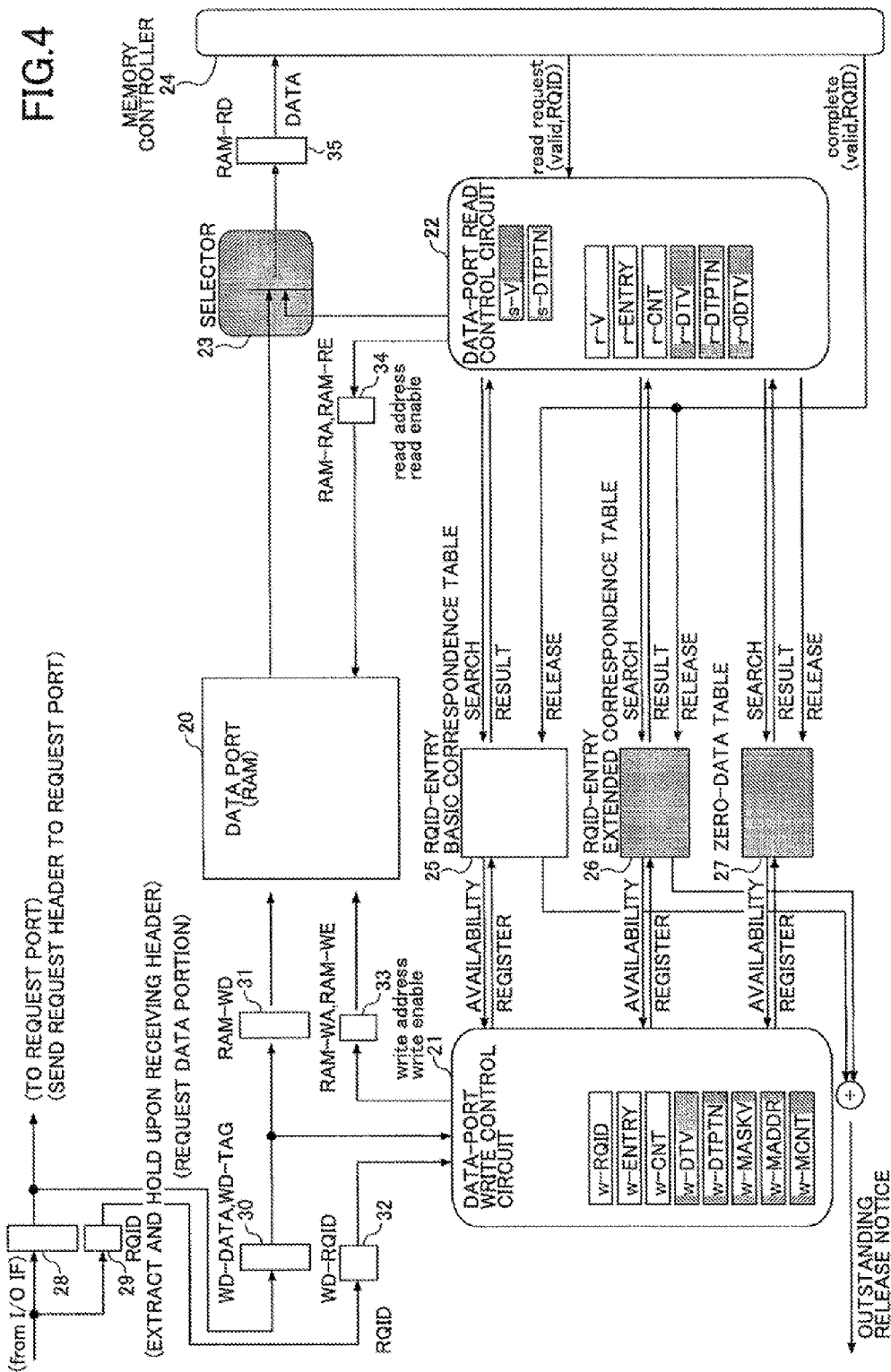
FIG. 4 is a drawing illustrating an example of the configuration of an I/O port.

FIG. 4 is a drawing illustrating an example of the configuration of the I/O port 14. The I/O port 14 includes a data port 20, a data-port write control circuit 21, a data-port read control circuit 22, a selector 23, a RQID-entry basic correspondence table 25, a RQID-entry extended correspondence table 26, and a zero-data table 27. The I/O port 14 further includes registers 28 through 35. A memory controller 24 corresponds to the memory controller 17 illustrated in FIG. 1.

FIG. 5 is a drawing for explaining a tag. When a store request is transferred through a data bus, a tag is transferred through a control bus concurrently with the store request. The tag may indicate the position at which valid data is present in the data portion of the store request. Specifically, two-bit tag TAG[1:0] assumes a value of "00", "01", "10", or "11" as illustrated in FIG. 5. Value "00" refers to invalid data. Value "01" refers to the first data in the data portion. Value "10" refers to intermediate data that are neither the first data nor the last data. Value "11" refers to the last data in the data portion. In the example illustrated in FIG. 2, for example, the order of data transferred in units of four bytes is denoted by numbers on the leftmost column. The tag of the $0^{th}$ data (i.e., header) is "00", and the tag of the $1^{st}$ data (i.e., byte0 through byte3) is "01". The tags of the $2^{nd}$ data (byte4 through byte7) through the $15^{th}$ data (byte56 through byte59) are "10". The tag of the $16^{th}$ data (i.e., byte60 through byte63) is "11".

By referring to FIG. 4 again, the data supplied from the I/O interface 13 is temporarily stored in the register 28. Further, the request identifier RQID is extracted and stored in the register 29. Among the data temporarily stored in the register 28, the request header portion is sent to the request port, and write data WE-DATA and a corresponding tag WD-TAG are transferred to the register 30. When the request is a store request, the write request identifier WD-RQID is transferred to the register 32. The write data WD-DATA and the corresponding tag WD-TAG stored in the register 30 as well as the write request identifier WD-RQID stored in the register 32 are supplied to the data-port write control circuit 21. Further, the write data WD-DATA stored in the register 30 is transferred to the register 31, and is stored in the register 31 as memory write data RAM-WD.

FIG. 6 is a drawing for explaining the division of a RAM that constitutes the data port 20. The data port 20 is a RAM (random access memory) that stores write data, and can accommodate maximum 8 data items. Specifically, the data port 20 has eight areas entry0 through entry7. One area can accommodate one write data item byte0 through byte63 that is 64 bytes long as illustrated in FIG. 2. The data port 20 can store eight write data items in total. As illustrated in FIG. 6, the area entry2, for example, is a memory area from memory address "8'h20" to memory address "8'h2F".

Figures 7, 8:
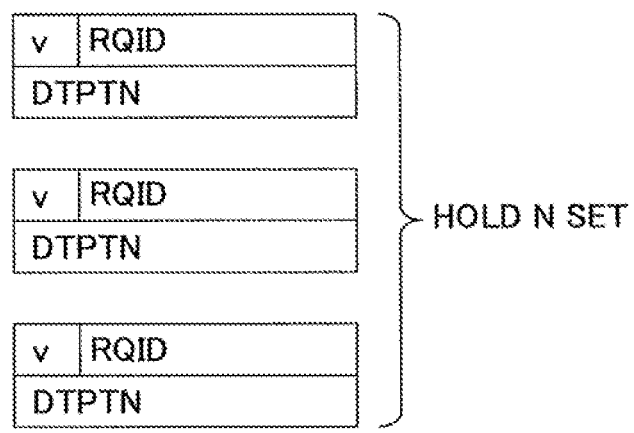
FIG. 7 is a drawing illustrating an example of the configuration of an RQID-entry basic correspondence table.
FIG. 8 is a drawing illustrating an example of the configuration of an RQID-entry extended correspondence table.

FIG. 7 is a drawing illustrating an example of the configuration of the RQID-entry basic correspondence table 25. The RQID-entry basic correspondence table 25 may be implemented by using a memory circuit such as a memory device, and has eight table entries in one-to-one correspondence to the eight areas entry0 through entry7 of the data port 20. In each table entry, a valid flag v and a request identifier RQID may be stored. When write data is stored in any given area of the data port 20, the request identifier RQID corresponding to this write data is stored in the table entry of the RQID-entry basic correspondence table 25 that corresponds to this given area. When write data is stored in the area entry2 of the data port 20, for example, the request identifier RQID corresponding to this write data is stored in the RQID field of the table entry for entry 2 in the RQID-entry basic correspondence table 25. Upon a valid request identifier RQID being registered in the RQID-entry basic correspondence table 25, a corresponding valid flag v is set to a value indicative of a valid state of the registered RQID (e.g., set to "1", for example). It may be noted that the data-port write control circuit 21 is configured to write data to the data port 20, to register the request identifier RQID in the RQID-entry basic correspondence table 25, and to set the valid flag v.

FIG. 8 is a drawing illustrating an example of the configuration of the RQID-entry extended correspondence table 26. The RQID-entry extended correspondence table 26 may be implemented by using a memory circuit such as a memory device, and includes n sets of data. Each set of data includes a valid flag v, a request identifier RQID, and a data pattern DTPTN. All the write data of one store request may be comprised of the same repeated data patterns. In such a case, such a data pattern is stored in the data pattern DTPTN, and the request identifier RQID corresponding to this write data is stored as the request identifier RQID. Upon data being registered, a corresponding valid flag v is set to a value indicative of a valid state of the registered RQID (e.g., set to "1", for example). In this case, the write data is written to the data port 20, but data indicative of the write data is not registered in the RQID-entry basic correspondence table 25. As a result, the above-noted data stored in the data port 20 is treated as invalid data, and will be overwritten upon arrival of new write data. It may be noted that the data-port write control circuit 21 is configured to perform write control with respect to the data port 20, to register a data pattern and the request identifier RQID in the RQID-entry extended correspondence table 26, and to set the valid flag v.

FIG. 9 is a drawing illustrating an example of the configuration of the zero-data table 27. The zero-data table 27 may be implemented by using a memory circuit such as a memory device, and includes m sets of data. Each set of data includes a valid flag v, an address value ADDRESS, and a data count CNT. When the write data includes data of which four bytes are all zero, such a zero-data portion is not written to the RAM of the data port 20, and relevant data is only registered in the zero-data table 27. The registered data include a write address (ADDRESS) indicative of the position at which the zero data starts and a data count (CNT) indicative of the number of zeros. Upon data being registered, a corresponding valid flag v is set to a value indicative of a valid state (e.g., set to "1", for example). It may be noted that the data-port write control circuit 21 is configured to perform write control with respect to the data port 20, to register the write address ADDRESS and the zero data count CNT in the zero-data table 27, and to set the valid flag v.

Figure 10:
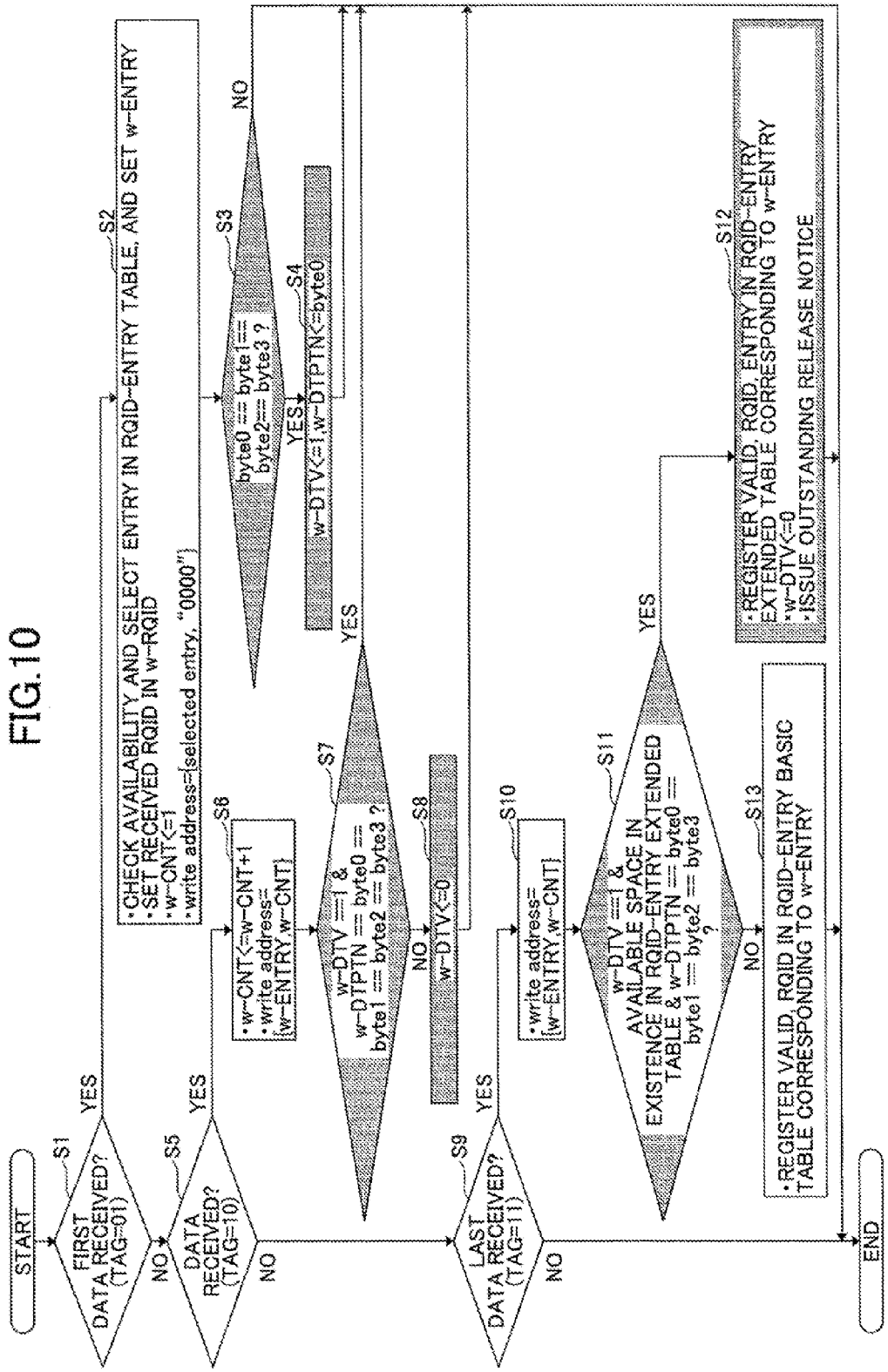
FIG. 10 is a flowchart illustrating an example of the operation of a data-port write control circuit.

FIG. 10 is a flowchart illustrating an example of the operation of the data-port write control circuit 21. This flowchart relates to a process of registering data in the RQID-entry extended correspondence table 26 when all the write data is the same data. Each step of FIG. 10 is performed by the data-port write control circuit 21. As illustrated in FIG. 4, the data-port write control circuit 21 includes latches for storing control-purpose parameters w-RQID, w-ENTRY, w-CNT, w-DTY, w-DTPTN, w-MASKV, w-MADDR, and w-MCNT.

In step S1, upon write data being received, the corresponding tag is checked to detect whether the received data is the first data (i.e., whether the tag is "01"). When the received data is the first data, an available area (i.e., available entry) of the RQID-entry basic correspondence table 25 is selected in step S2, and the identifier indicative of the selected area is set in w-ENTRY. Further, the request identifier RQID of the received request is set in w-RQID, and w-CNT is set equal to "1". Moreover, the write address is set equal to {selected entry, "0000"}. When the area entry2 is selected, for example, w-ENTRY is set equal to "2", and the write address is set equal to "20". This write address is used as RAM-WA that is stored by the data-port write control circuit 21 in the register 33 as illustrated in FIG. 4.

In step S3, a check is made as to whether all the four data bytes byte0 through byte3 are the same. When they are not the same, the procedure comes to an end. When they are the same, in step S4, w-DTV is set equal to "1" and w-DTPTN is set equal to byte0.

When the received data is not the first data, a check is made in step S5 as to whether the received data is intermediate data (i.e., whether the corresponding tag is "10"). When the received data is the intermediate data, in step S6, w-CNT is incremented by one, and the write address is set equal to (w-ENTRY, w-CNT). In step S7, a check is made as to whether the conditions that all the four bytes of the received data are equal to W-DTPTN and that w-DTV is equal to "1" are satisfied. When these conditions are satisfied, the procedure comes to an end. When these conditions are not satisfied, w-DTV is set equal to "0".

When the received data is neither the first data nor intermediate data, a check is made in step S9 as to whether the received data is the last data (i.e., whether the corresponding tag is "11"). When the received data is the last data, in step S10, the write address is set equal to {w-ENTRY, w-CNT}. In step S11, a check is made as to whether the conditions that all the four bytes of the received data are equal to W-DTPTN, that w-DTV is equal to "1", and that the RQID-entry extended correspondence table 26 has available space are satisfied. It may be noted that the fact that w-DTV is equal to "1" at this point in time means that all the data of the first data through the data immediately preceding the last data have been the same data (i.e., equal to the data stored in w-DTPTN).

When the conditions checked in step S11 are satisfied, in step S12, w-RQID and w-ENTRY are registered in the RQID-entry extended correspondence table 26, and the valid flag v is set equal to a valid value. Further, w-DTV is set equal to "0", and an outstanding release notice is sent to the I/O interface 13. In response to the outstanding release notice, the transmitting side decreases a relevant credit by one. In this case, the data written to the data port 20 will not be used later, and will be overwritten by write data that is to be subsequently received.

When the conditions checked in step S11 are not satisfied, in step S13, w-RQID is registered in the table entry of the RQID-entry basic correspondence table 25 that corresponds to w-ENTRY, and the valid flag v is set equal to a valid value. In this case, the data written to the data port 20 will be maintained, and will be used at the time of a subsequent read operation.

Figure 11:
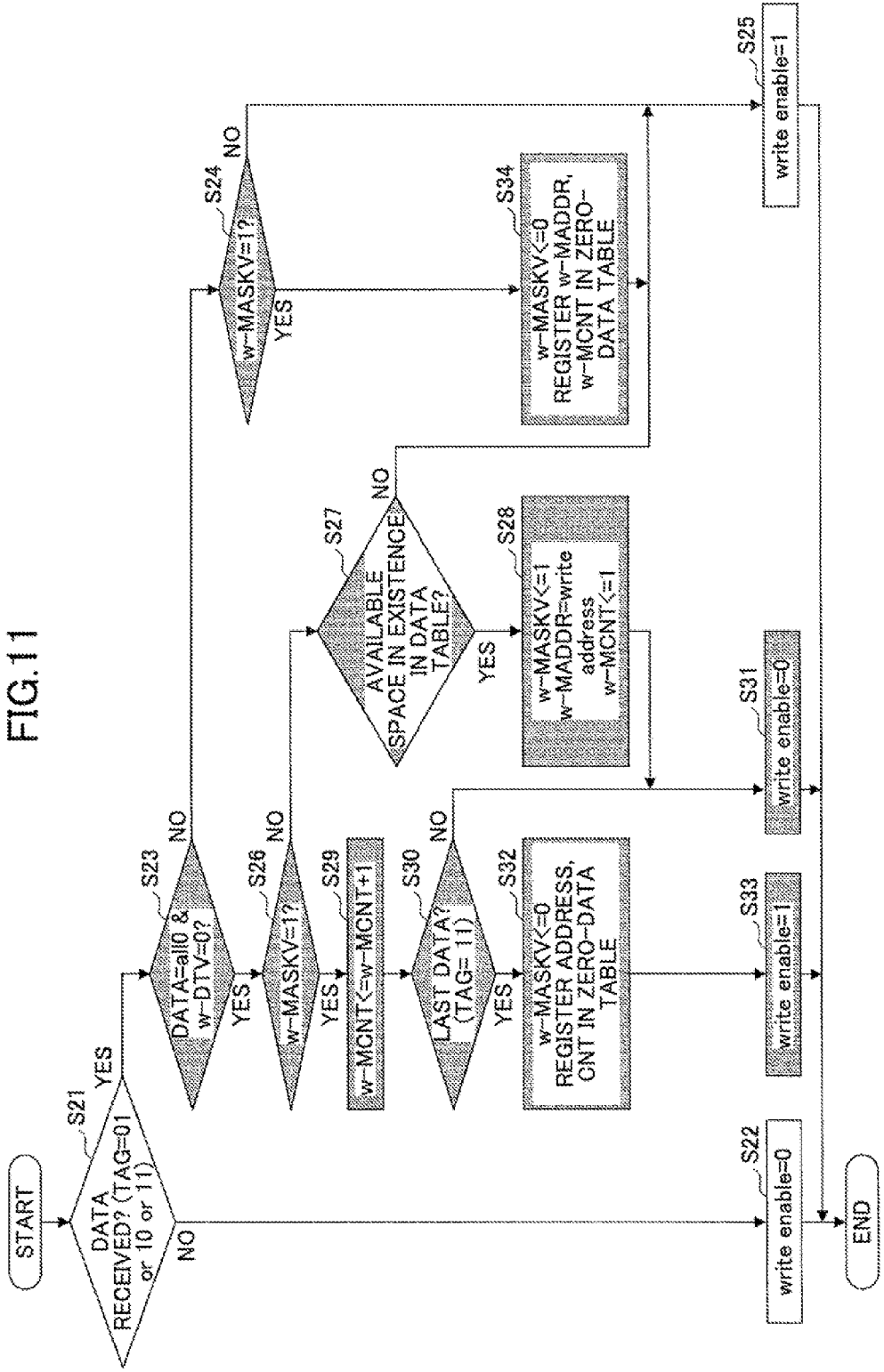
FIG. 11 is a flowchart illustrating an example of the operation of the data-port write control circuit.

FIG. 11 is a flowchart illustrating an example of the operation of the data-port write control circuit 21. This flowchart relates to a process of registering data in the zero-data table 27 when write data includes data that are all comprised of zeros. Each step of FIG. 11 is performed by the data-port write control circuit 21. The operation illustrated in the flowchart of FIG. 11 is performed in parallel with the operation illustrated in the flowchart of FIG. 10.

In step S21, upon write data being received, the corresponding tag is checked to detect whether the received data is valid data (i.e., whether the tag is "01", "10", or "11"). When the received data is valid data, a check is made in step S23 as to whether the write data are all zeros and w-DTV is "0". When all the write data of the first data are zeros, w-DTV is set equal to "1" in step S4 of the flowchart illustrated in FIG. 10, so that this check made in step S23 produces a negative answer (N). Namely, when all the data from the first data to the last data are zeros, such data are registered in the RQID-entry extended correspondence table 26 according to the flowchart illustrated in FIG. 10, and are not registered in the zero-data table 27.

When the result of the check in step S23 is No (N), a check is made in step S24 as to whether w-MASKV is "1". This w-MASKV is a flag that is set equal to "1" when the conditions that the zero-data table 27 has available space and that the last received data is all zero are satisfied. When w-MASKV is not "1", a write enable signal is set equal to "1" in step S25. As a result, RAM-WE stored in the register 33 by the data-port write control circuit 21 in FIG. 4 is set equal to "1". Namely, when some of the write data is not zero, the write data is stored in the data port 20 as it is.

When the result of the check in step S23 is Yes (Y), a check is made in step S26 as to whether w-MASKV is "1". When the last received data is not all zero, for example, w-MASKV is not "1", so that the procedure proceeds to step S27. In step S27, a check is made as to whether the zero-data table 27 has available space. In the case of no available space, the write enable signal is set equal to "1" in step S25. With this arrangement, the write data is stored in the data port 20 as it is. When the zero-data table 27 has available space, the procedure proceeds to step S28, in which w-MASKV is set equal to "1", and the write address of the current received data is set in w-MADDR, with w-MCNT being set equal to "1.". Thereafter, the write enable signal is set equal to "0" in step S31. With this arrangement, the writing of data to the data port 20 is aborted.

When w-MASKV is "1" according to the check in step S26, the procedure proceeds to step S29, in which w-MCNT is incremented by one. Thereafter, a check is made at step S30 as to whether the received data is the last data (i.e., whether the corresponding tag is "11"). When the received data is not the last data, the write enable signal is set equal to "0" in step S31. With this arrangement, the state in which the writing of data to the data port 20 is aborted is maintained. When the received data is the last data, in step S32, w-MASKV is reset to "0", and w-MADDR is registered in the address ADDRESS of the zero-data table 27, with w-MCNT being registered in the data count CNT. Thereafter, the write enable signal is set equal to "1" in step S33.

When the result of the check made in step S23 is No (N), and w-MASKV is "1" in step S24, w-MASKV is reset to "0" in step S34 because the preceding received data is zero while the current received data is not zero. Further, w-MADDR is registered in the address ADDRESS of the zero-data table 27, and w-MCNT is registered in the data count CNT. Thereafter, the write enable signal is set equal to "1" in step S25.

When the result of the check made in step S21 is No (N), the write enable signal is set equal to "0" in step S22. Namely, when the received data is not valid write data, the data is not written to the data port 20.

Figure 12:
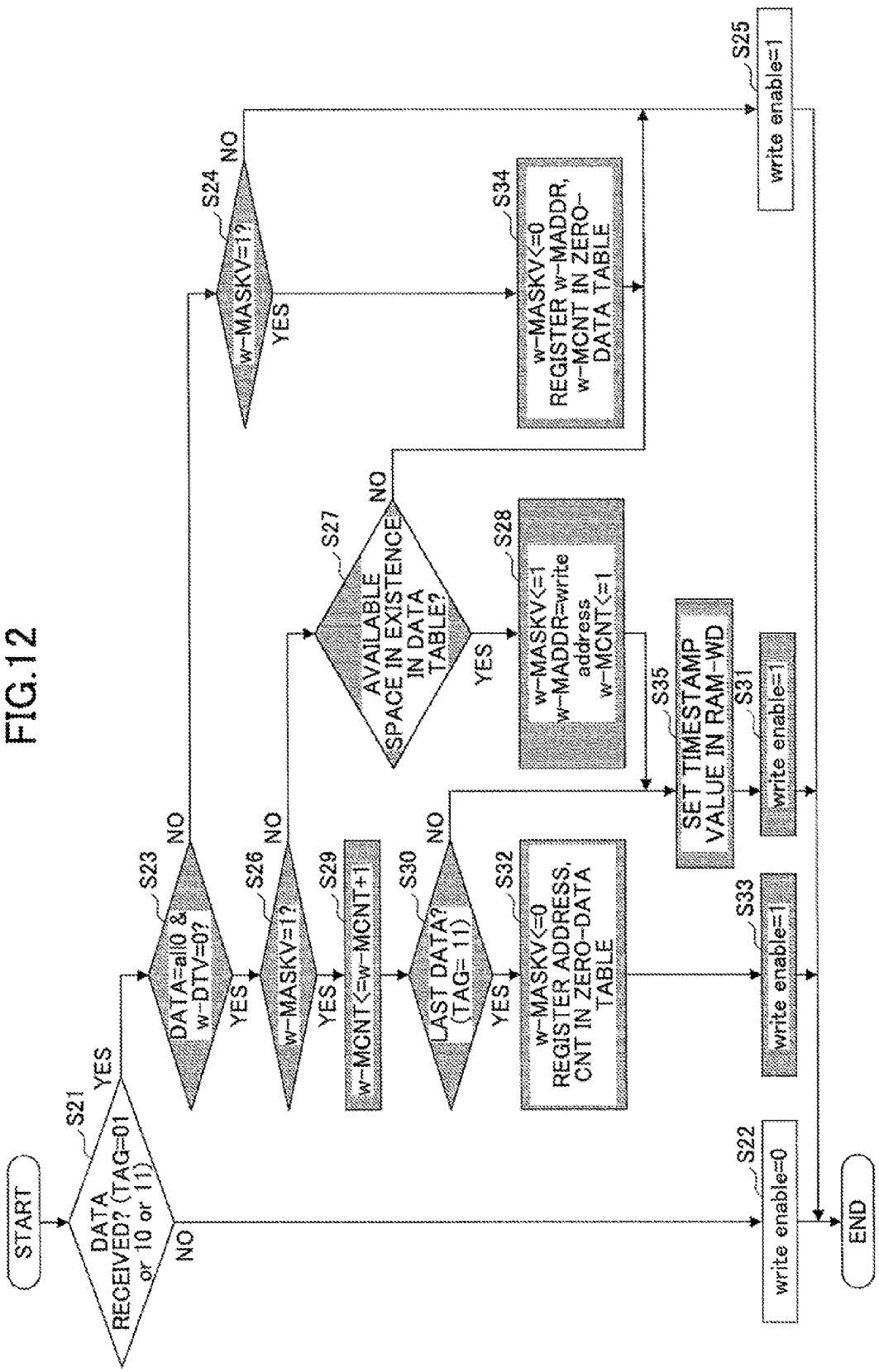
FIG. 12 is a flowchart illustrating a variation of the operation of the flowchart illustrated in FIG. 11.

FIG. 12 is a flowchart illustrating a variation of the operation of the flowchart illustrated in FIG. 11. In FIG. 12, processes the same as or similar to those of FIG. 11 are referred to by the same or similar numerals, and a description thereof will be omitted as appropriate. In the flowchart illustrated in FIG. 12, step S35 is added before step S31. In this step S35, a timestamp value is set in RAM-WD (i.e., write data stored in the register 31 illustrated in FIG. 4). Further, the write enable signal is set equal to "1" rather than to "0" in step S31. With this arrangement, timestamp information (i.e., debug information), instead of the write data that is zero, is written to the data port 20. The timestamp information may be supplied from an external source, or may be generated within the CPU 10 by use of a latch and a counter. The timestamp information may be collected as RAM dump information upon detecting a problem in the chip inclusive of the CPU 10. With this arrangement, the timestamp information may be utilized as history information about data processing, and may be utilized in a debug operation to analyze the problem.

Figure 13:
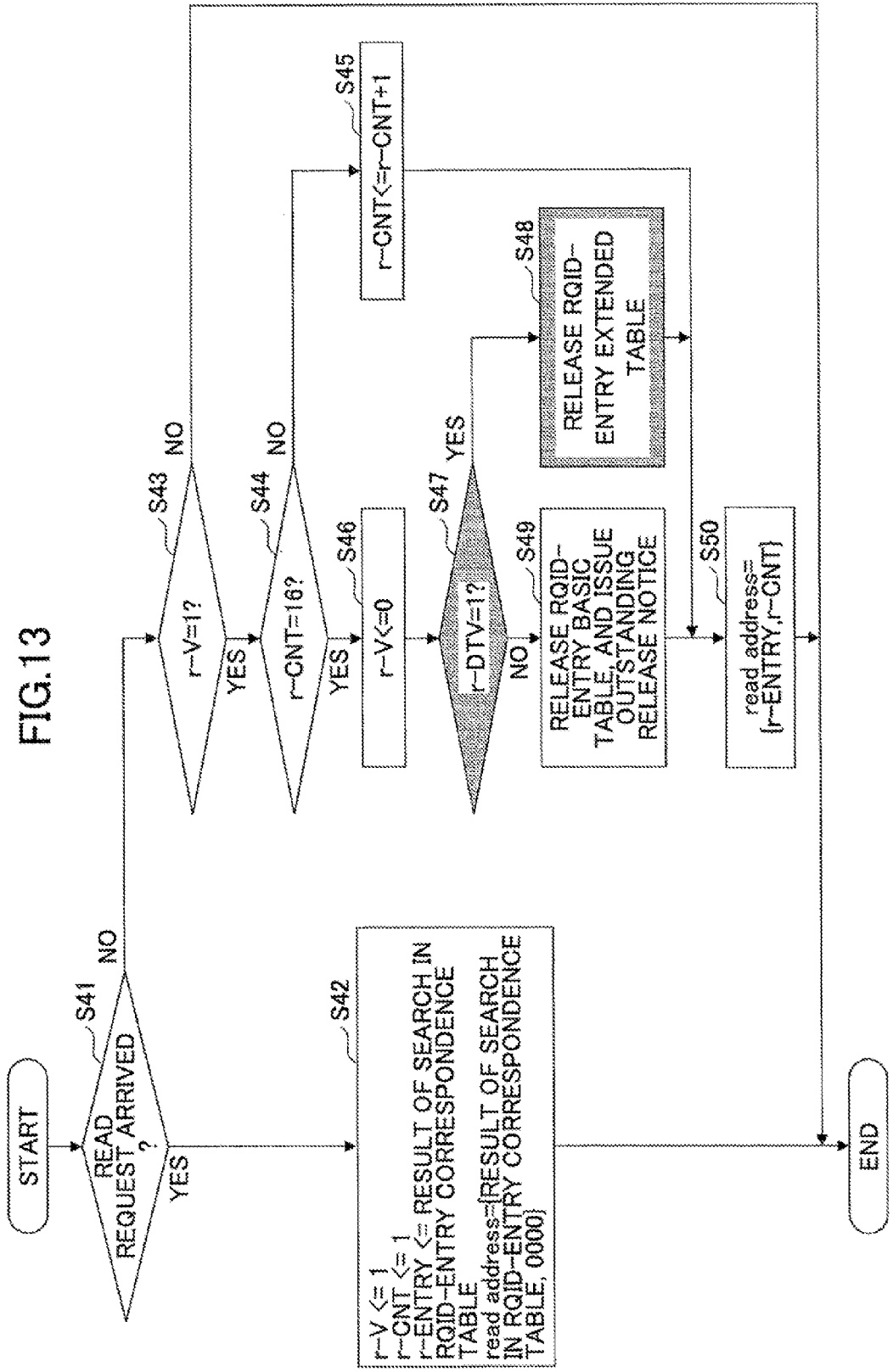
FIG. 13 is a flowchart illustrating an example of the operation of a data-port read control circuit.

FIG. 13 is a flowchart illustrating an example of the operation of the data-port read control circuit 22. This flowchart relates to a process of reading data based on the RQID-entry basic correspondence table 25 or the RQID-entry extended correspondence table 26. Each step of FIG. 13 is performed by the data-port read control circuit 22. As illustrated in FIG. 4, the data-port read control circuit 22 includes latches for storing control-purpose parameters r-V, r-ENTRY, r-CNT, r-DTV, r-DTPTN, r-0DTV, s-V, and s-DTPTN.

In step S41, a check is made as to whether a read request has arrived from the memory controller 24. When the check result indicates Yes (Y), in step S42, r-V and r-CNT are set equal to "1", and the result of searching in the RQID-entry basic correspondence table 25 is set in r-ENTRY. Moreover, the read address is set equal to {r-ENTRY, "0000"}. Namely, RAM-RA stored in the register 34 illustrated in FIG. 4 is set equal to the noted read address value.

The read request includes a request identifier RQID corresponding to the data to be read. An RQID corresponding to this request identifier RQID is searched for in the RQID-entry basic correspondence table 25, and an area (i.e., entry) corresponding to the RQID found by the search is set in r-ENTRY as described above.

When the result of the check in step S41 is No (N), a check is made in step S43 as to whether r-V is "1". It may be noted that r-V is "1" after the arrival of the read request and before the completion of the read operation. When r-V is "1", the procedure proceeds to step S44, in which a check is made as to whether r-CNT is "16". Here, r-CNT indicates the number of data items that have been read. When the result of the check is No (N), r-CNT is incremented by one in step S45. In subsequent step S50, the read address is set equal to {r-ENTRY, r-CNT}.

When the result of the check in step S44 is Yes (Y), which indicates that the read data is the last data, r-V is reset to "0" in step S46. In step S47, a check is made as to whether r-DTV is "1". As will be described later, r-DTV assumes "1" when the data to be read is registered in the RQID-entry extended correspondence table 26, and assumes "0" otherwise. When the result of the check in step S47 indicates that r-DTV is "1", the RQID-entry extended correspondence table 26 is released in step S48. Namely, since reading is completed up to the last data, the corresponding entry in the RQID-entry extended correspondence table 26 is no longer necessary, so that the corresponding valid flag is changed to a value indicative of an invalid state of the corresponding entry. When the result of the check in step S47 indicates that r-DTV is not "1", the RQID-entry basic correspondence table 25 is released in step S49. Namely, since reading is completed up to the last data, the corresponding entry in the RQID-entry basic correspondence table 25 is no longer necessary, so that the corresponding valid flag is changed to a value indicative of an invalid state of the corresponding entry. Further, an outstanding release notice is sent to the I/O interface 13. In response to the outstanding release notice, the transmitting side decreases a relevant credit by one. In subsequent step S50, the read address is set equal to {r-ENTRY, r-CNT}. When the RQID-entry extended correspondence table 26 is being used, no data is read from the data port 20. In such a case, the above-noted read address will not be used despite the fact that the address is set.

Figure 14:
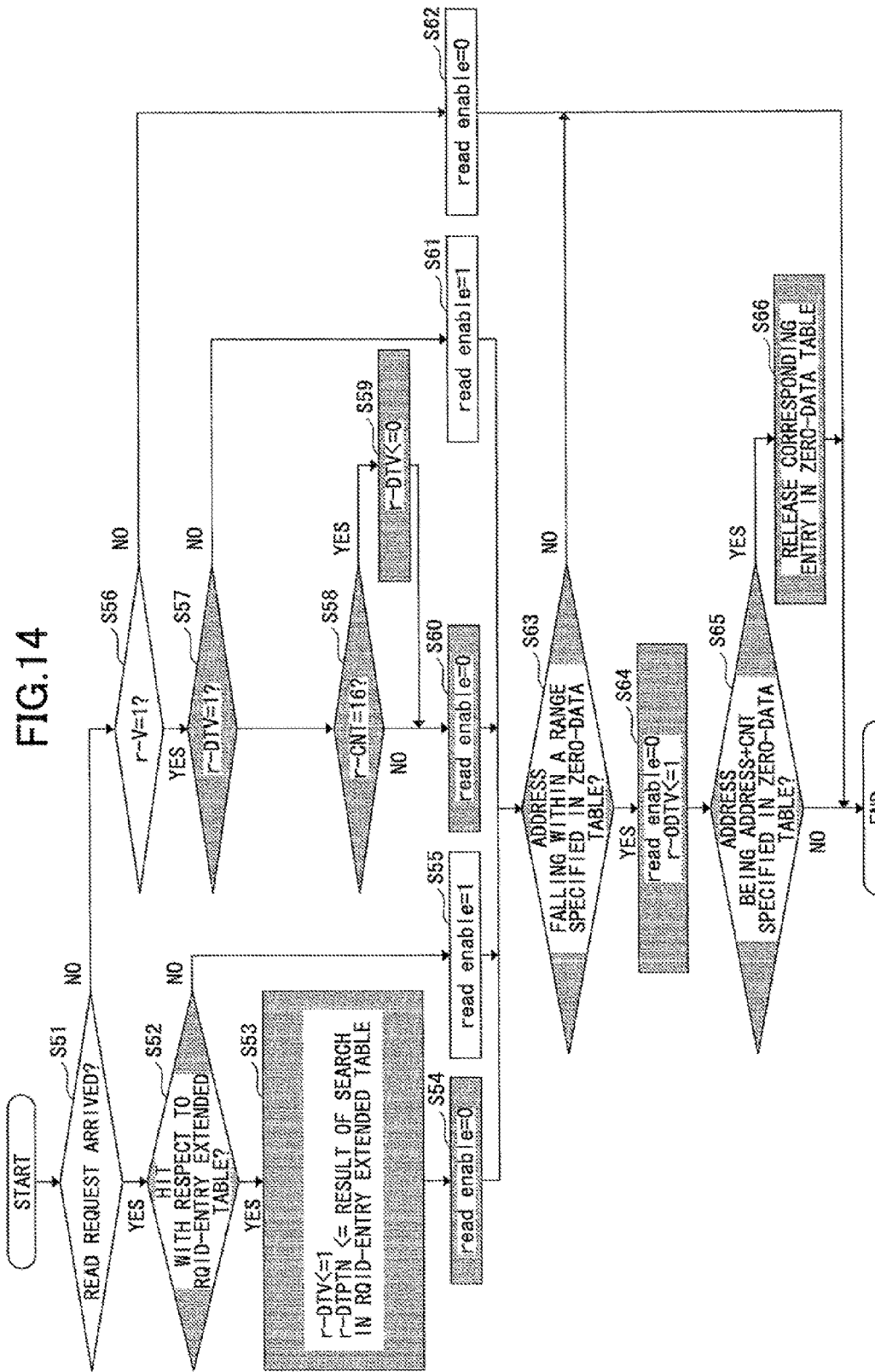
FIG. 14 is a flowchart illustrating an example of the operation of the data-port read control circuit.

FIG. 14 is a flowchart illustrating an example of the operation of the data-port read control circuit 22. This flowchart relates to read control of the data port 20 and to a read process based on the zero-data table 27. Each step of FIG. 14 is performed by the data-port read control circuit 22. The operation illustrated in the flowchart of FIG. 14 is performed in parallel with the operation illustrated in the flowchart of FIG. 13.

In step S51, a check is made as to whether a read request has arrived from the memory controller 24. When the result of the check is Yes (Y), a check is made in step S52 as to whether hit is detected with respect to the RQID-entry extended correspondence table 26. Namely, a check is made as to whether an RQID corresponding to the request identifier RQID included in the read request is registered in the RQID-entry extended correspondence table 26. When the check in step S52 detects a hit, in step S53, r-DIV is set equal to "1", and the corresponding DTPTN of the RQID-entry extended correspondence table 26 is set in r-DTPN. Thereafter, a read enable signal is set equal to "0" in step S54. Namely, RAM-RE stored in the register 34 illustrated in FIG. 4 is set equal to "0", so that no data is read from the data port 20.

When the check in step S52 detects no hit, the read enable signal is set equal to "1" in step S55 to permit a data read operation with respect to the data port 20. Namely, RAM-RE stored in the register 34 illustrated in FIG. 4 is set equal to "1", so that data is read from the data port 20.

When the result of the check in step S51 is No (N), a check is made in step S56 as to whether r-V is "1". In the case r-V being not "1", the read enable signal is set equal to "0" in step S62, and the procedure comes to an end. In the case of r-V being "1", a check is made in step S57 as to whether r-DTV is "1". When r-DTV is not "1", which indicates no hit with respect to the RQID-entry extended correspondence table 26, the read enable signal is set equal to "1" in step S61. When r-DTV is "1", which indicates a hit with respect to the RQID-entry extended correspondence table 26, a check is made in step S58 as to whether r-CNT is 16. Here, r-CNT indicates the number of data items that have been read. When the result of the check in step S58 is No (N), the read enable signal is set equal to "0" in step S60. When the result of the check in step S58 is Yes (Y), r-DTV is set equal to "0", followed by setting the read enable signal equal to "0".

After steps S54, 355, S60, and S61, a check is made in step S63 as to whether the read address falls within the address range specified in the zero-data table 27. Namely, a check is made as to whether the current read address is situated between ADDRESS and ADDRESS+CNT of the corresponding entry of the zero-data table 27. When the read address is outside the specified address range, the procedure comes to an end. When the read address is within the specified address range, the read enable signal is set equal to "0" in step S64, and r-0DTV is set equal to "1". In subsequent step S65, a check is made as to whether the current read address is equal to ADDRESS+CNT specified in the zero-data table 27. In the case of equality being found, the corresponding entry of the zero-data table 27 is released in step S66. Namely, the corresponding valid flag of the zero-data table 27 is set equal to a value indicative of an invalid state.

Figure 15:
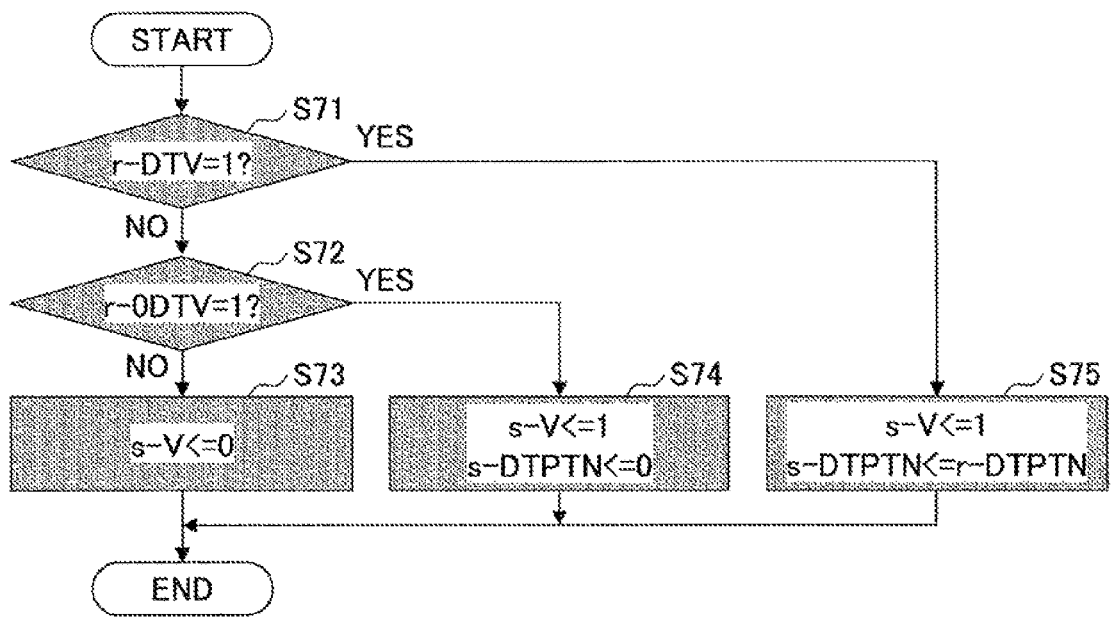
FIG. 15 is a flowchart illustrating an example of another operation of the data-port read control circuit.

FIG. 15 is a flowchart illustrating an example of another operation of the data-port read control circuit 22. This flowchart relates to a process of setting read data and a signal for controlling selection made by the selector 23. Each step of FIG. 15 is performed by the data-port read control circuit 22. The operation illustrated in the flowchart of FIG. 15 is performed in parallel with the operation illustrated in the flowchart of FIG. 13.

In step S71, a check is made as to whether r-DTV is "1". When r-DTV is "1", s-V is set equal to "1" and s-DTPTN is set equal to r-DTPTN. As will be described later, the selector 23 selects s-DTPTN supplied from the data-port read control circuit 22 when s-V is "1".

When r-DTV is not "1" in step S71, a check is made in step S72 as to whether r-0DTV is "1". When r-0DTV is "1", s-V is set equal to "1" and s-DTPTN is set equal to "0".

When r-0DTV is not "1" in step S72, s-V is set equal to "0" in step S73. As will be described later, the selector 23 selects read data supplied from the data port 20 when s-V is "0".

Figure 16:
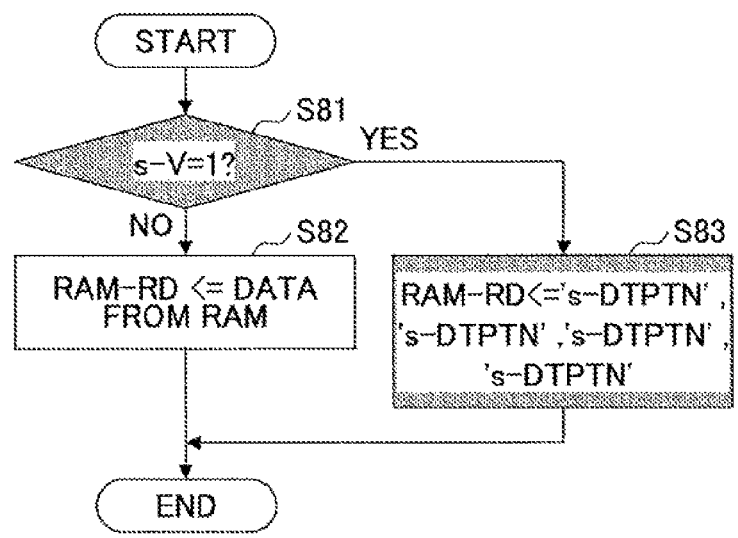
FIG. 16 is a flowchart illustrating an example of the operation of a selector.

FIG. 16 is a flowchart illustrating an example of the operation of the selector 23. In step S81, a check is made as to whether s-V is "1". In the case of s-V being "1", the selector 23 selects s-DTPTN supplied from the data-port read control circuit 22. As a result, RAM-RD stored in the register 35 illustrated in FIG. 4 becomes 4-byte data in which four bytes each being one-byte-width s-DTPTN are arranged in a row as illustrated in step S83. In the case of s-V being "0", the selector 23 selects read data supplied from the data port 20. As a result, RAM-RD stored in the register 35 illustrated in FIG. 4 becomes the read data read from the RAM of the data port 20 as illustrated in step S82. The data stored in the register 35 in this manner is supplied to the memory controller 24 as the data corresponding to the read request.

Figure 17:
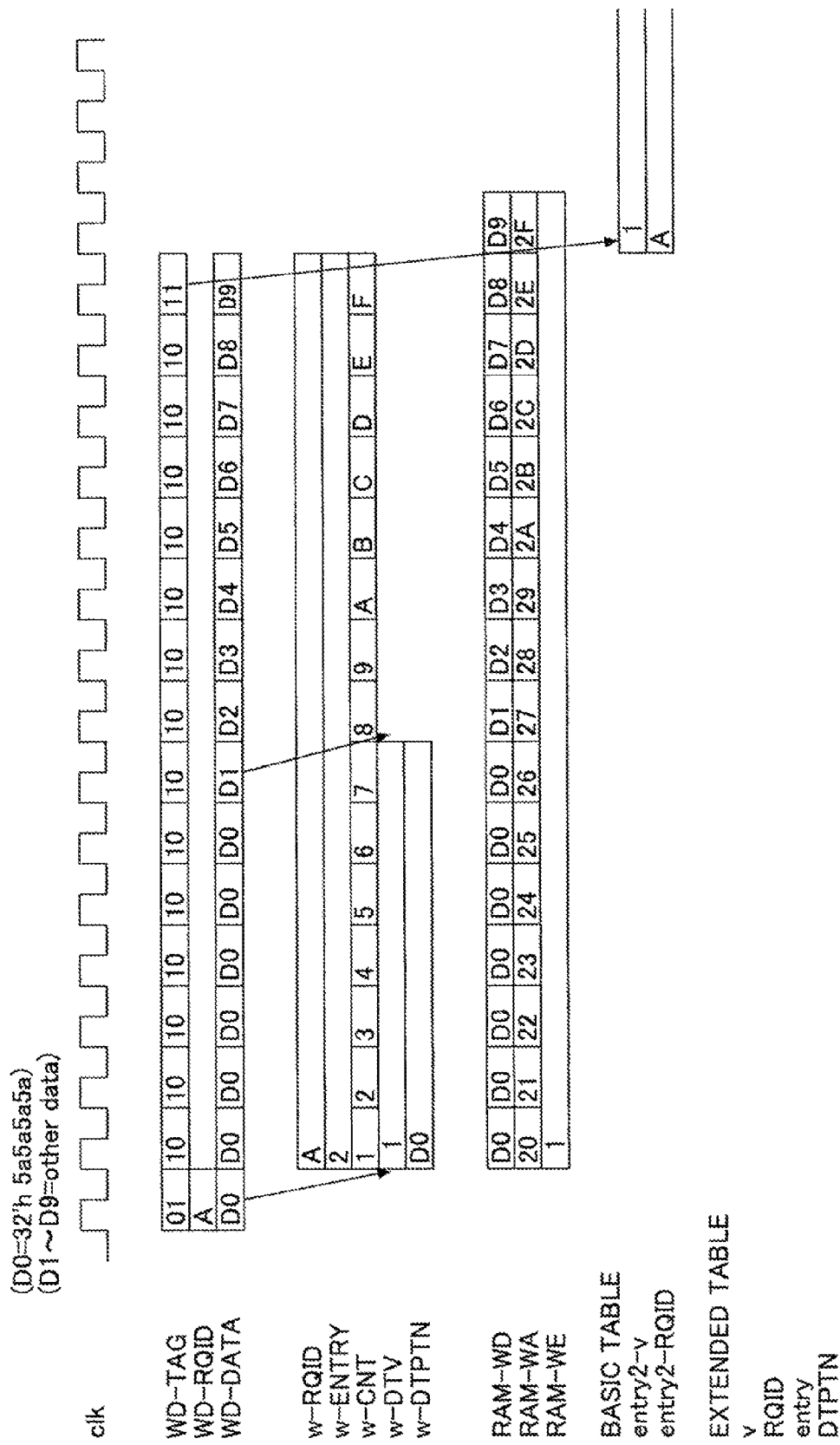
FIG. 17 is a drawing illustrating an example of a data write operation.
Figure 18:
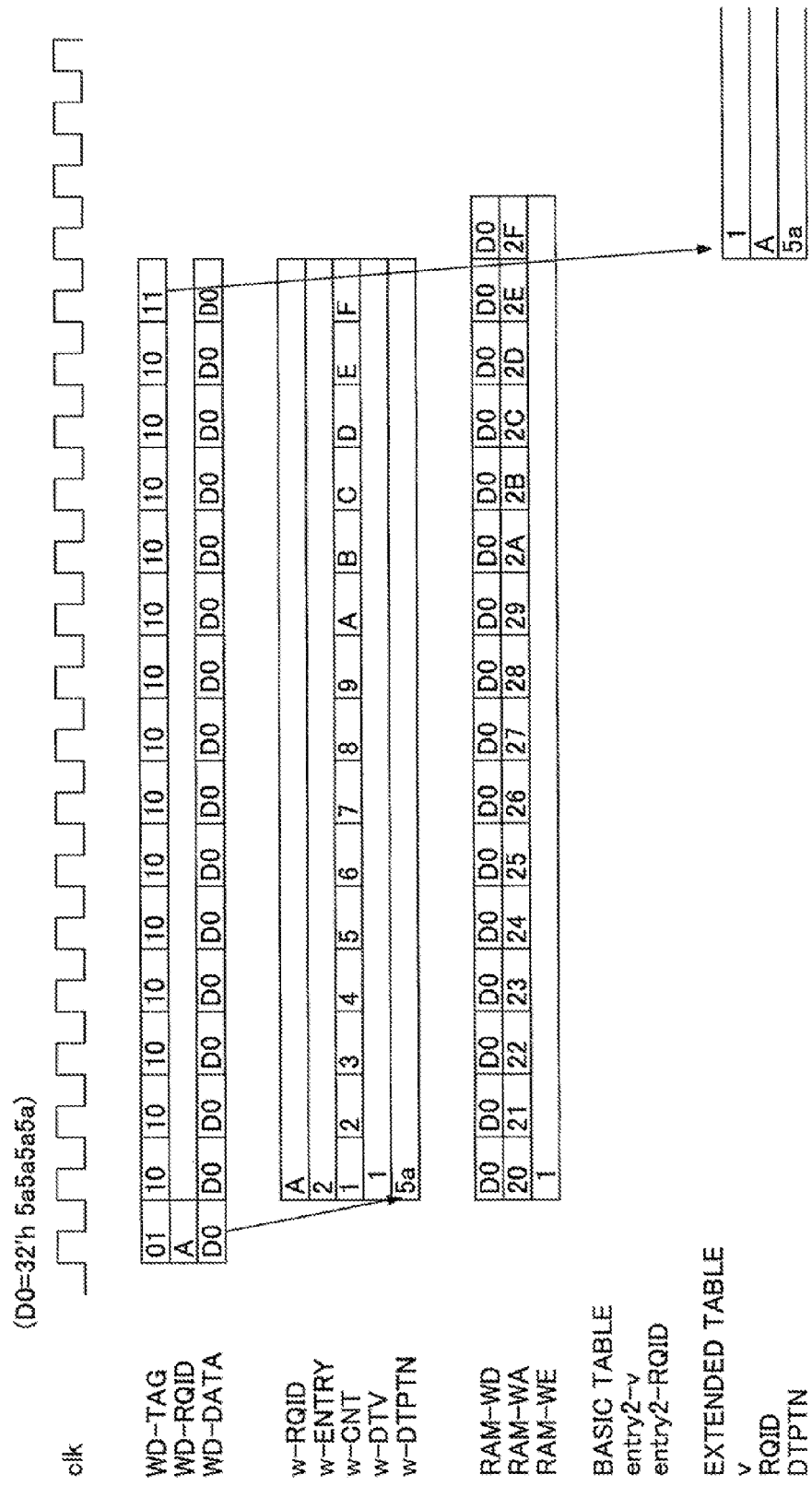
FIG. 18 is a drawing illustrating another example of the data write operation.

FIG. 17 is a drawing illustrating an example of a data write operation. In this example, data D0 comprised of the same four bytes is supplied first as write data WD-DATA corresponding to the request having a request identifier (WD- RQID: A. As a result, w-DTV is set equal to "1", and w-DTPTN is set equal to D0. The write enable signal RAM-WE is "1" at this point in time. Further, w-ENTRY is 2, which indicates that the area entry2 is used as a data write area. Accordingly, data D0 is written as write data RAM-WD to the data port 20 at positions that are indicated as "20", "21", "22", and so on by the address RAM-WA. However, the eighth data is D1, which is different from D0, so that w-DTV is not set equal to "1" any longer. Subsequently, upon arrival of the last data, data are registered in the RQID-entry basic correspondence table 25. Namely, the valid flag v for the area entry2 is set equal to "1" in the RQID-entry basic correspondence table 25, and, also, the RQID for the area entry2 is set equal to the write request identifier A FIG. 18 is a drawing illustrating another example of a data write operation. In this example, all the data from the first data to the last data for the request identifier (WD-RQID) A are data D0 comprised of the same four bytes. Upon arrival of the last data, thus, data are registered in the RQID-entry extended correspondence table 26. Namely, the valid flag v is set equal to "1" in the RQID-entry extended correspondence table 26, and, also, the RQID is set equal to the write request identifier A, with DTPTN being set equal to 5a (=D0).

Figure 19:
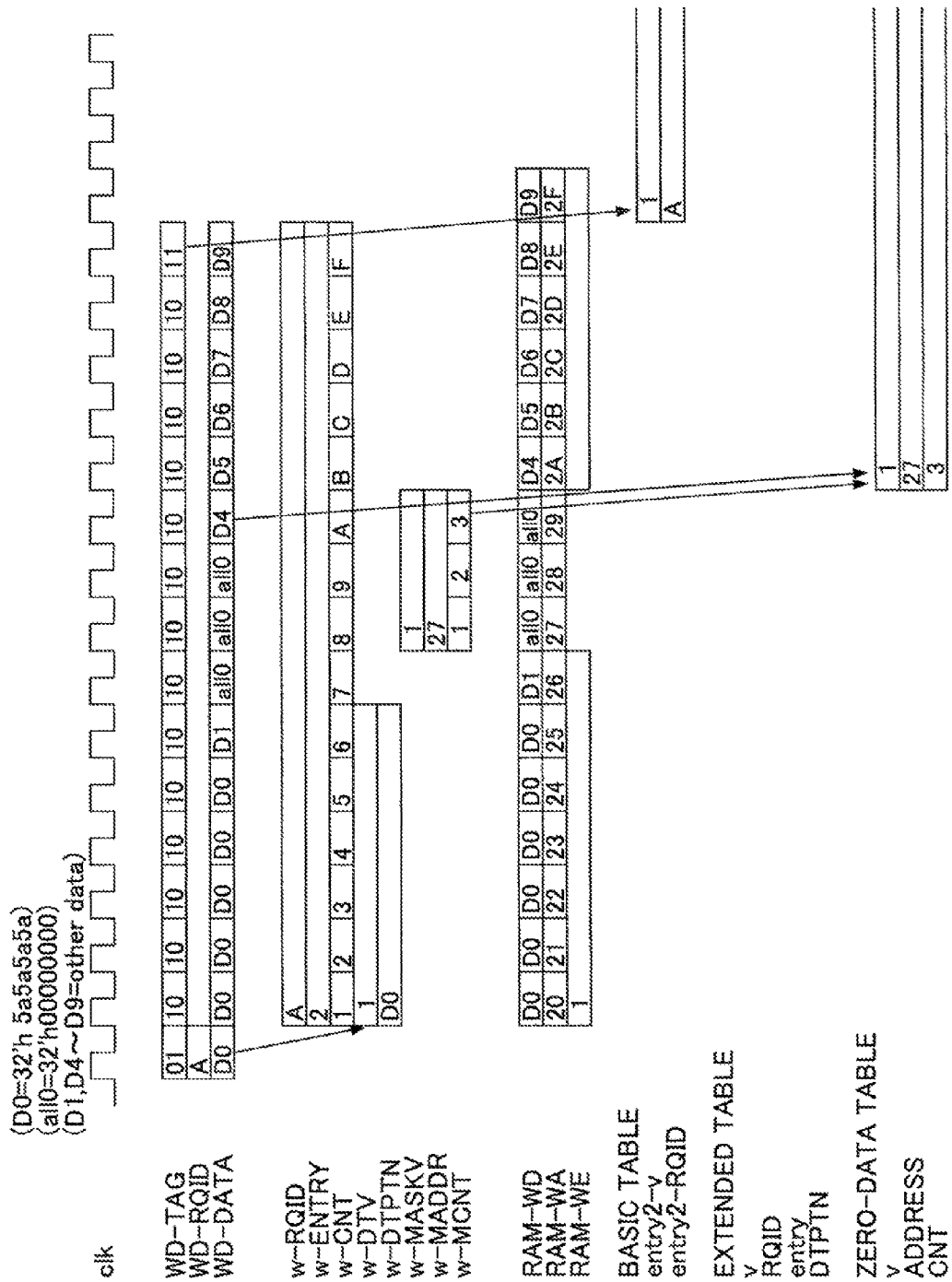
FIG. 19 is a drawing illustrating yet another example of the data write operation.
Figure 20:
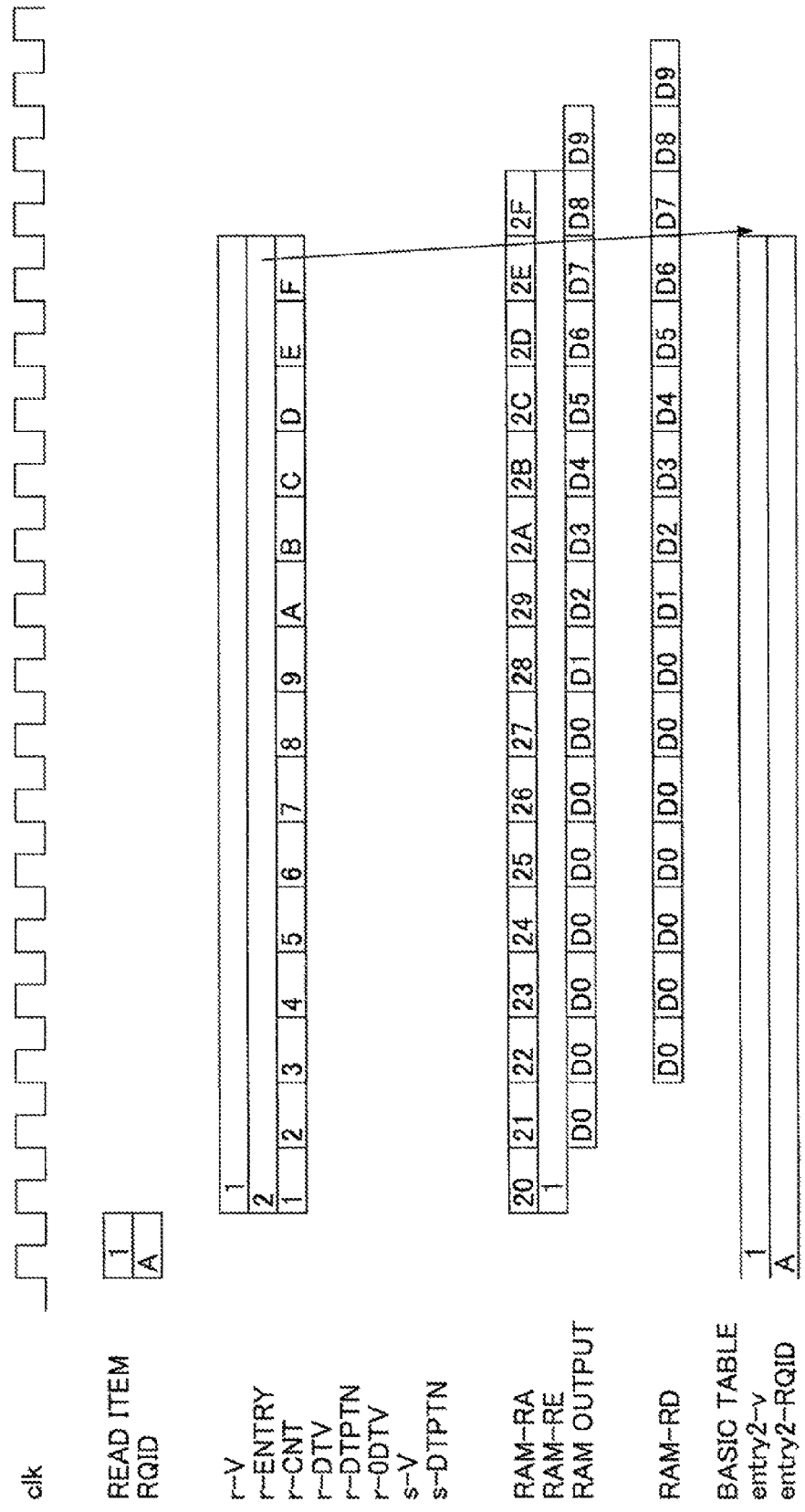
FIG. 20 is a drawing illustrating an example of a read process.

FIG. 19 is a drawing illustrating yet another example of a data write operation. In this example, data D0 comprised of the same four bytes is supplied first as write data WD-DATA corresponding to the request identifier (WD-RQID) A. As a result, w-DTV is set equal to "1", and w-DTPTN is set equal to D0. The write enable signal RAM-WE is "1" at this point in time. Further, w-ENTRY is 2, which indicates that the area entry2 is used as a data write area. Accordingly, data D0 is written as write data RAM-WD to the data port 20 at positions that are indicated as "20", "21", "22", and so on by the address RAM-WA. However, the seventh data is D1, which is different from D0, so that w-DTV is not set equal to "1" any longer. Each of the eighth data to the tenth data is data all0 whose four bytes are all zeros. In response, w-MASKV is set equal to "1", and w-MADDR is set equal to "27" that is the corresponding write address, with w-MCNT being counted up to "3". Since the eleventh data is not all0, registration to the zero-data table 27 is performed at this point in time. Namely, ADDRESS of the zero-data table 27 is set equal to "27", and the data count CNT is set equal to "3". Upon arrival of the last data, data are registered in the RQID-entry basic correspondence table 25. Namely, the valid flag v for the area entry2 is set equal to "1" in the RQID-entry basic correspondence table 25, and, also, the RQID for the area entry2 is set equal to the write request identifier A FIG. 20 is a drawing illustrating an example of a read process. Upon arrival of a read request having a request identifier RQID that is A, r-V is set equal to "1". Further, since the area entry2 corresponds to the request identifier A in the RQID-entry basic correspondence table 25, r-ENTRY indicative of a read area is set equal to "2". As a result, read addresses "20", "21", "22", and so on are obtained, and data successively read from the data port 20 are supplied to the memory controller 24 as data RAM-RD.

Figure 21:
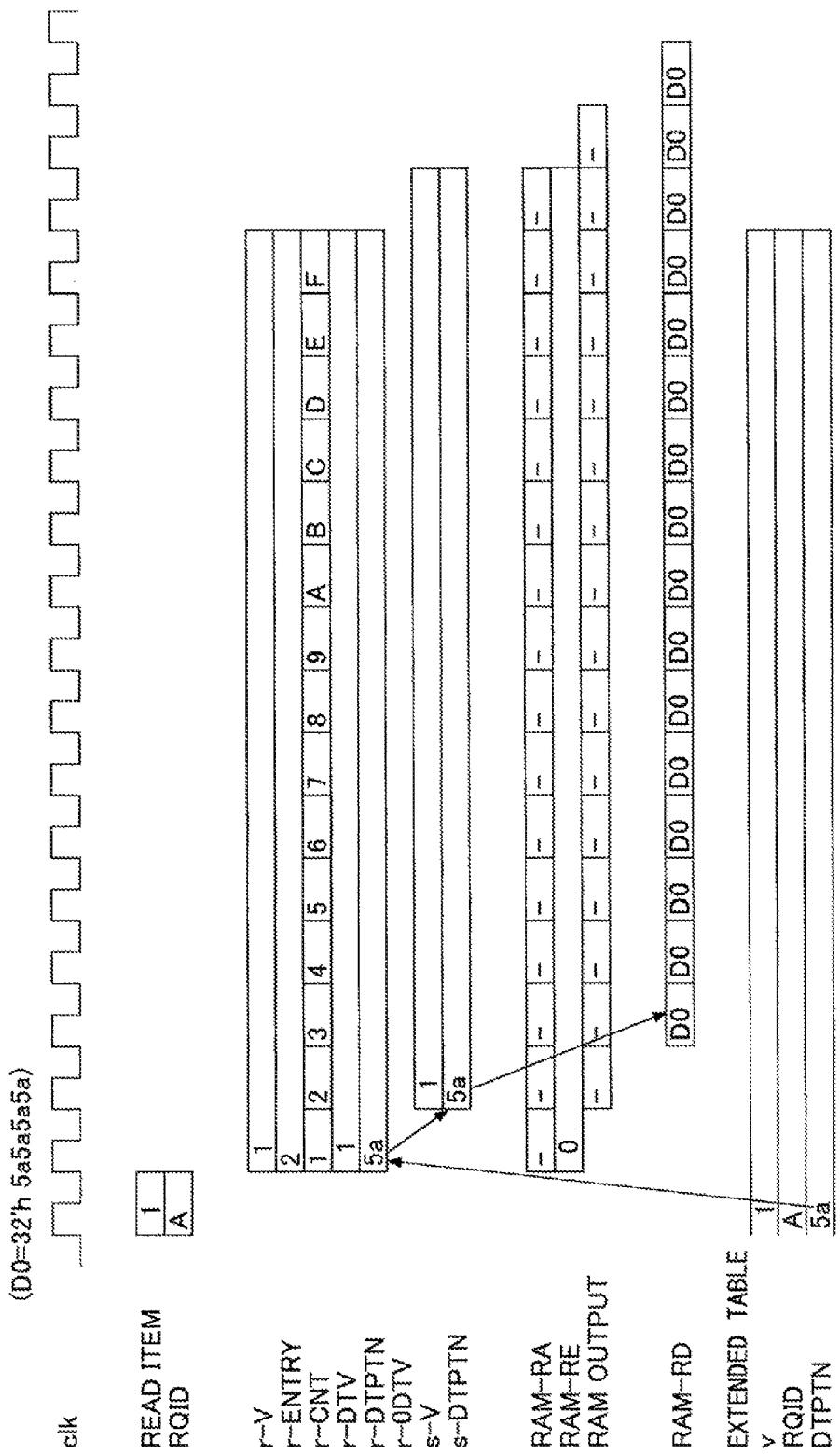
FIG. 21 is a drawing illustrating another example of the read process.

FIG. 21 is a drawing illustrating another example of a read process. Upon arrival of a read request having a request identifier RQID that is A, r-V is set equal to "1". Further, since a hit is detected with respect to the RQID-entry extended correspondence table 26 in response to the request identifier A, DTPTN="5a" of the RQID-entry extended correspondence table 26 is stored in r-DTPTN. In response to the hit detected with respect to the RQID-entry extended correspondence table 26, also, r-DTV is set equal to "1". Since r-DTV is "1", s-V is set equal to "1", and the selector 23 selects and outputs s-DTPTN. As a result, D0="5a" is supplied to the memory controller 24 one after another as data RAM-RD.

Figure 22:
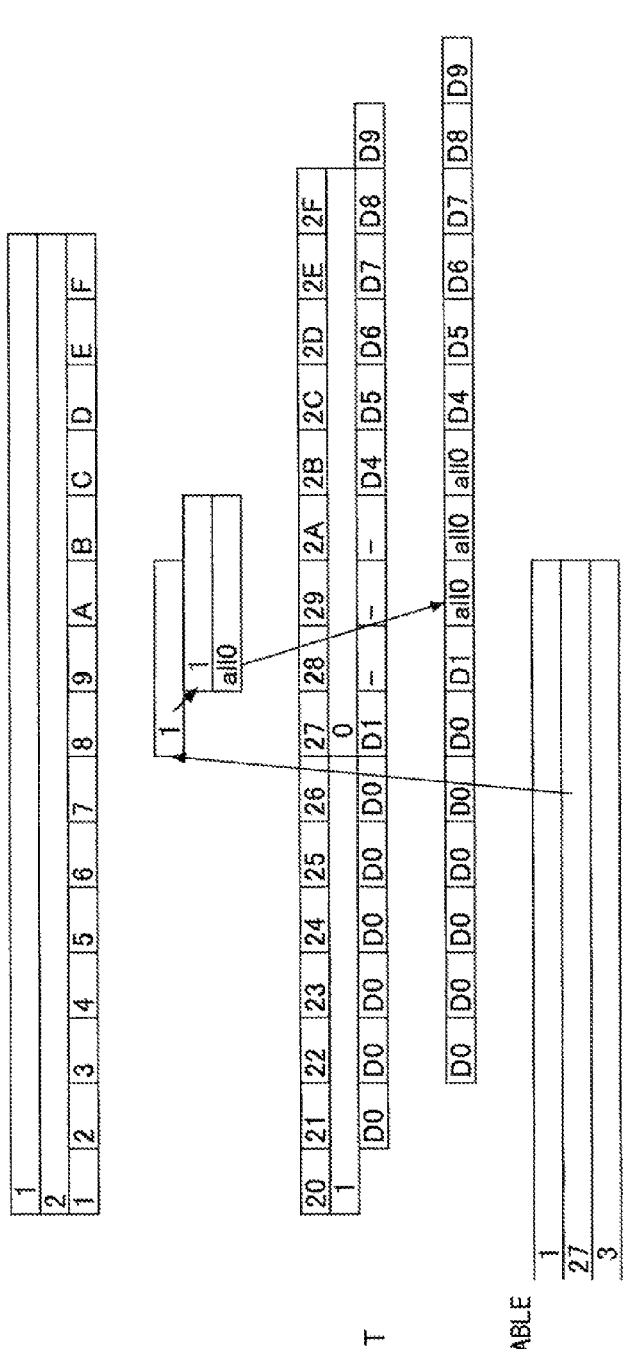
FIG. 22 is a drawing illustrating yet another example of the read process.

FIG. 22 is a drawing illustrating yet another example of a read process. Upon arrival of a read request having a request identifier RQID that is A, r-V is set equal to "1". Further, this example is directed to a case in which the area entry2 corresponds to the request identifier A in the RQID-entry basic correspondence table 25 in the same manner as in FIG. 19. Accordingly, r-ENTRY indicative of a read area is set equal to "2". As a result, read addresses "20", "21", "22", and so on are obtained, and data successively read from the data port 20 are supplied to the memory controller 24 as data RAM-RD. However, the read address "27" used for the eighth read operation corresponds to the address of the zero-data table 27, so that r-0DTV is set equal to "1". Since r-0DTV is "1", s-V is set equal to "1", and the data all0 (i.e., 32-bit-width data whose four bytes are zeros) are stored in s-DTPTN. Since s-V is equal to "1", the selector 23 selects and outputs s-DTPTN. The data all0 is supplied to the memory controller 24 one after another as data RAM-RD. The data all0 is output only when the read address is between "27" and "29" (=27+3−1). On and after the read address "2A", data successively read from the data port 20 are supplied to the memory controller 24 as data RAM-RD.

The above embodiments are directed to a case in which the data pattern that is not written to the data port 20 is the data all0 that has the four bytes thereof being all "0". Alternatively, data all1 that has the four bytes thereof being all "1" may be detected, and writing of such data to the data port 20 may be refrained from. Alternatively, data that has the four bytes thereof being each "10101010" may be detected, and the writing of the data to the data port 20 may be refrained from. In so doing, the data pattern that is supposed to be detected may be externally set. Provision may then be made such that when write data matches the externally set data pattern, the writing of the data to the data port 20 is refrained from.

Further, a mechanism to generate a data pattern according to a specific algorithm may be provided in place of the RQID-entry extended correspondence table 26. Such a pattern generation mechanism may be used to generate data, thereby making it unnecessary to hold data in memory. In the following, a description will be given of an example of the configuration which uses a pattern generation mechanism.

Figure 23:
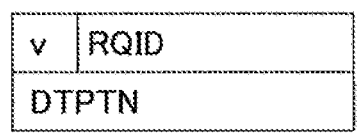
FIG. 23 is a drawing illustrating a variation of the RQID-entry extended correspondence table.
Figure 24:
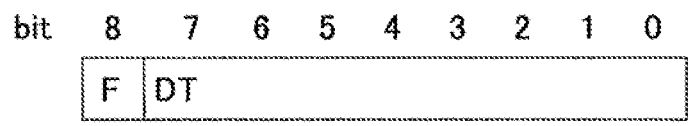
FIG. 24 is a drawing illustrating an example of the configuration of the DTPTN of the RQID-entry extended correspondence table illustrated in FIG. 23.

FIG. 23 is a drawing illustrating a variation of the RQID-entry extended correspondence table. FIG. 24 is a drawing illustrating an example of the configuration of the DTPTN of the RQID-entry extended correspondence table illustrated in FIG. 23. The RQID-entry extended correspondence table illustrated in FIG. 23 includes a valid flag v, a request identifier RQID, and a data pattern DTPTN. The data pattern DTPTN is 9 bits long as illustrated in FIG. 24. A data pattern DT is stored in bit0 through bit7, and a flag F is stored in the most significant bit (i.e., bit8). In the case of the flag F being "0", the write data corresponding to the write request has the four bytes thereof being each equal to DT. In the case of the flag F being "1", the write data corresponding to the write request is equal to the data pattern that is generated by a specific pattern generation algorithm using DT as the initial value.

Figure 25:
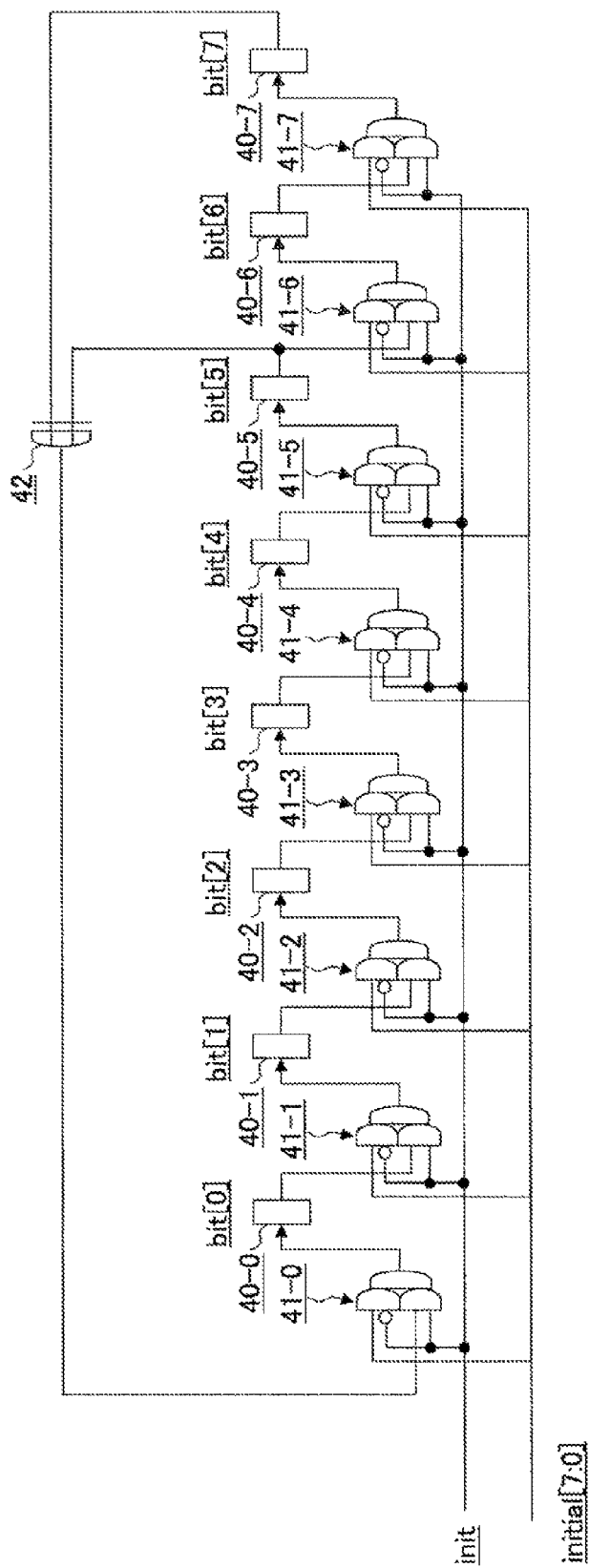
FIG. 25 is a drawing illustrating an example of a pattern generation circuit.

FIG. 25 is a drawing illustrating an example of a pattern generation circuit. The pattern generation circuit includes flip-flops 40-0 through 40-7, logic circuits 41-0 through 41-7, and an XOR gate 42. In this pattern generation circuit, an initial value initial[7:0] (i.e., DT illustrated in FIG. 24) is supplied to the flip-flops 40-0 through 40-7 through the logic circuits 41-0 through 41-7, respectively, when init is equal to "0". When init is equal to "1", the values stored in the flip-flops 40-0 through 40-6 are stored in the next-stage flip-flops 40-1 through 40-7 through the logic circuits 41-1 through 41-7, respectively. The fifth bit bit[5] output from the flip-flop 40-5 and the seventh bit bit[7] output from the flip-flop 40-7 are subjected to an XOR operation, the resulting value of which is stored in the flip-flop 40-0 through the logic circuit 41-0. With this arrangement, patterns are successively generated from the initial value.

FIG. 26 is a table illustrating the logic of pattern generation performed by the pattern generation circuit illustrated in FIG. 25. As illustrated in this table, the $0^{th}$ bit through $6^{th}$ bit in the present cycle are used as the $1^{st}$ bit through $7^{th}$ bit in the next cycle. Further, the result of performing an XOR operation between the $7^{th}$ bit and the $5^{th}$ bit in the present cycle is used as the $0^{th}$ bit in the next cycle.

FIG. 27 is a drawing illustrating an example of pattern generation performed by the pattern generation circuit illustrated in FIG. 25. In this example, the initial value is "00100100". Based on this initial value, bit patterns are generated in successive cycles as illustrated in FIG. 27.

Figure 28:
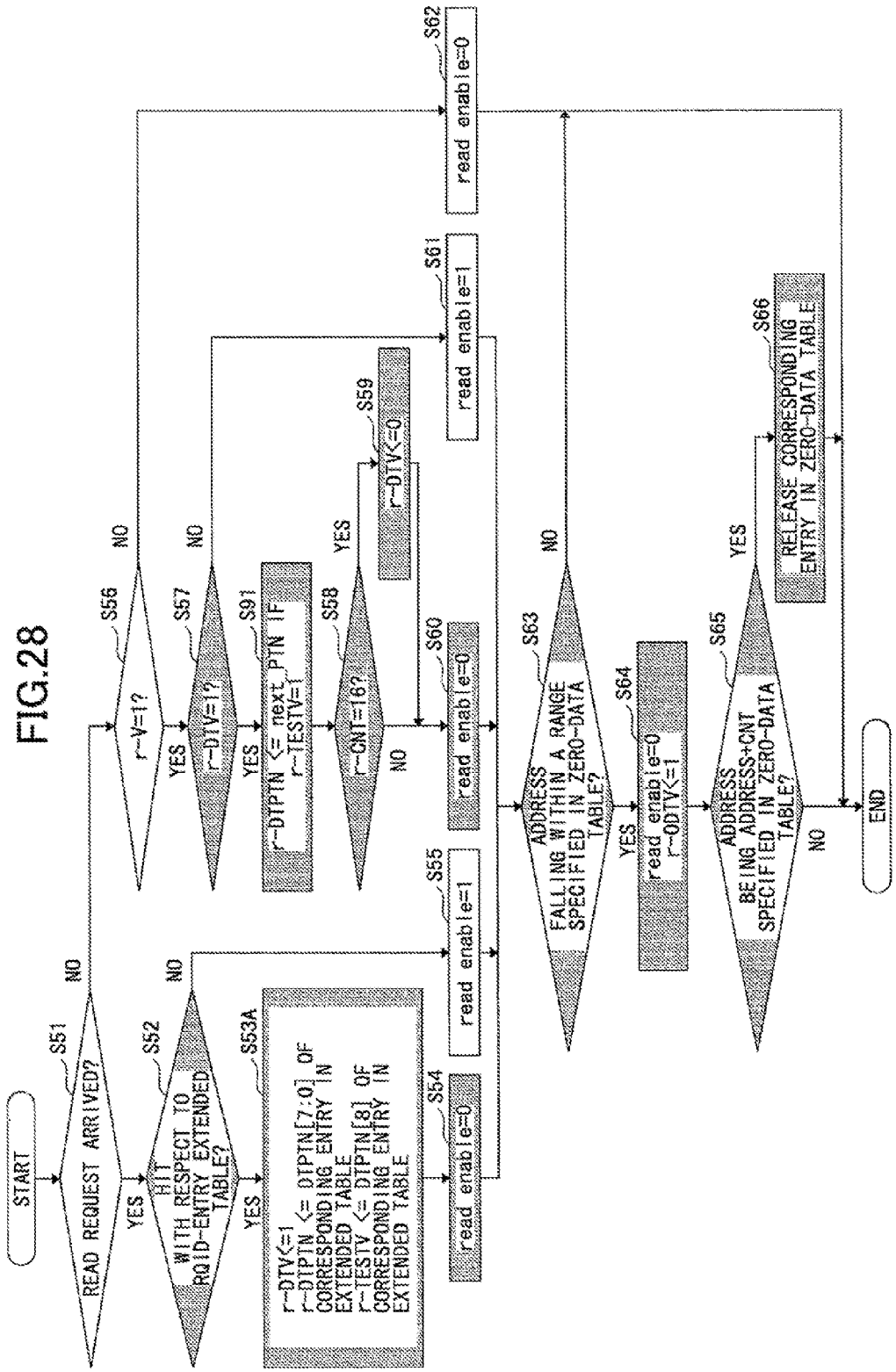
FIG. 28 is a flowchart illustrating an example of the operation of the data-port read control circuit.

FIG. 28 is a flowchart illustrating an example of the operation of the data-port read control circuit 22. This flowchart relates to read control of the data port 20 and to a read process based on the zero-data table 27. Each step of FIG. 28 is performed by the data-port read control circuit 22. In FIG. 28, the same or corresponding processes as those of FIG. 14 are referred to by the same or corresponding step numbers, and a description thereof will be omitted as appropriate.

In the flowchart illustrated in FIG. 28, step S35A is provided in place of step S53 illustrated in FIG. 14. Further, step S91 is provided between step S57 and step S58. In step S53A, r-DIV is set equal to "1", and corresponding DTPTN[7:0] of the RQID-entry extended correspondence table illustrated in FIG. 23 is set in r-DTPTN. Further, corresponding DTPTN[8] of the RQID-entry extended correspondence table illustrated in FIG. 23 is set in r-TESTV.

In step S91, r-DTPTN is set equal to nextPTN if r-TESTV is equal to "1". Here, nextPTN is a pattern generated according to the logic table illustrated in FIG. 26 by the pattern generation circuit illustrated in FIG. 25. In this manner, patterns generated by the pattern generation circuit are supplied to the memory controller 24 in response to a read request.

According to one embodiment, a data transfer circuit and a data transfer method are provided to make efficient use of buffer resources of a data port.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A data transfer circuit, comprising:
a memory;
a write control circuit configured to control writing of write data to the memory;
a read control circuit configured to control reading of data from the memory;
a first memory circuit configured to register a store position in the memory at which data written to the memory is stored; and
a second memory circuit configured to store a data pattern when the write data is comprised of repeated patterns each identical to the data pattern,
wherein the write control circuit does not register the store position in the first memory circuit with respect to the written data that is comprised of the repeated patterns each identical to the data pattern stored in the second memory circuit, and the read control circuit reads the data pattern from the second memory circuit rather than from the memory to supply the read data pattern to a source issuing a first read request when data requested by the first read request corresponds to the data pattern stored in the second memory circuit.

2. The data transfer circuit as claimed in claim 1, further comprising a third memory circuit,
wherein the write control circuit prevents at least part of the write data from being written to the memory when the at least part of the write data is a predetermined data pattern, and stores in the third memory circuit one or more addresses in the memory at which writing the at least part of the write data is refrained from,
and wherein the read control circuit supplies the predetermined data pattern to a source issuing a second read request when a read address corresponding to the second read request matches one of the one or more addresses stored in the third memory circuit.

3. The data transfer circuit as claimed in claim 2, wherein the write control circuit writes debug information to the memory at the one or more addresses at which writing the at least part of the write data is refrained from.

4. The data transfer circuit as claimed in claim 1, further comprising a pattern generation circuit configured to generate a sequence of data patterns, wherein the read control circuit supplies the sequence of data patterns generated by the pattern generation circuit to the source issuing the first read request.

5. A data transfer method, comprising:
writing first write data and second write data to a memory;
registering in a first memory circuit a first store position in the memory at which the first write data is stored when the first write data is not comprised of repeated patterns;
registering a data pattern in a second memory circuit without registering in the first memory circuit a second store position in the memory at which the second write data is stored when the second write data is comprised of repeated patterns each identical to the data pattern;
reading the first write data from the first store position in the memory to supply the read first write data to a source issuing a first read request when data requested by the first read request is the data stored in the first store position stored in the first memory circuit; and
reading the data pattern from the second memory circuit rather than from the memory to supply the read data pattern to a source issuing a second read request when data requested by the second read request corresponds to the data pattern stored in the second memory circuit.

* * * * *